United States Patent [19]

Brooks

[11] Patent Number: 4,524,320
[45] Date of Patent: Jun. 18, 1985

[54] CONDUCTOR IDENTIFYING PROBE AND VOLTAGE SUPPLY DEVICE

[75] Inventor: Harvey L. Brooks, Gainesville, Ga.

[73] Assignee: Gary A. Harrelson, Marbleton, Ga.; a part interest

[21] Appl. No.: 506,400

[22] Filed: Jun. 17, 1983

[51] Int. Cl.³ .............................................. G01R 19/00
[52] U.S. Cl. ............................................. 324/66; 324/51
[58] Field of Search .................. 324/66, 51, 52, 73 R; 179/175.3 A

[56] References Cited

U.S. PATENT DOCUMENTS

| 1,738,710 | 12/1929 | Jones | 324/66 |
| 2,133,384 | 10/1938 | Fisher et al. | 324/66 |
| 2,822,519 | 2/1958 | Murphy | 324/66 |
| 2,953,744 | 9/1960 | Miller et al. | 324/66 |
| 3,054,949 | 9/1962 | Bates et al. | 324/66 |
| 3,514,552 | 5/1970 | Smith | 324/66 X |
| 4,041,383 | 8/1977 | Howard | 324/66 |
| 4,114,091 | 9/1978 | Howard | 324/66 |

FOREIGN PATENT DOCUMENTS

| 16685 | 2/1977 | Japan | 324/66 |
| 0924432 | 4/1963 | United Kingdom | 324/66 |

Primary Examiner—Stanley T. Krawczewicz
Attorney, Agent, or Firm—Mason, Fenwick & Lawrence

[57] ABSTRACT

A probe-type electrical identifying device for identifying individual conductors in a multiple conductor group such as in a cable or extending through a conduit pipe, including a conductor indicator probe and voltage supply unit, wherein the probe has a pair of light emitting diodes (LEDs) of different color and is capable of distinctively identifying as many as five individual conductors in the group. Connector leads having alligator clamps are provided to connect to the individual conductors at one end. The voltage supply unit has switches assigned to five of the connector leads and electrical circuitry is provided to enable distinctive identification of the five different conductors by different activation of the two LEDs in the probe.

14 Claims, 5 Drawing Figures

CONDUCTOR IDENTIFYING PROBE AND VOLTAGE SUPPLY DEVICE

BACKGROUND AND OBJECTS OF THE INVENTION

The present invention relates in general to electrical circuit testing or identifying devices for identifying individual conductors in a multiple conductor system such as in a cable or extending through a conduit pipe, and more particularly to a portable probe type electrical conductor-identifying device for identifying individual conductors or different phase conductors in a plural conductor array or conduit, having a single probe with a light system capable of identifying the individual conductors.

Heretofore, many devices have been proposed for identifying different cable wires or individual conductors in a plural conductor cable or in a plural wire conduit, where it becomes necessary or desirable at relatively remote opposite ends of the cable or conduit to be able to identify the particular wires or conductors for installation, repair or modification of electrical circuits, telephone lines, and similar applications. Various devices have been proposed in prior patents for achieving identification of the individual cable wires by various colored lights, or lights activated in a different manner or allocated to specific individual wires, and in some cases identification has been indicated by different audio signals. For example, in Jones U.S. Pat.No. 1,738,710, a plurality of differently colored lights are connected to the individual wires or conductors at one end of the multi-conductor system, and the conductors are individually energized. In the Parmenter U.S. Pat. No. 2,488,556, the MacGregor U.S. Pat. No. 2,768,428, the Miller et al U.S. Pat. No. 2,953,744, the Rollins et al U.S. Pat. No. 3,476,888, the Scott U.S. Pat. No. 3,480,856, the Smith U.S. Pat. No. 3,514,552, and the Kurata et al U.S. Pat. No. 3,521,161, cable wire identifying systems are disclosed involving distinctive lights signalling the individual wires in various ways, and in the Fisher et al U.S. Pat. No. 2,133,384, the individual conductors are identified by different audio signals. However, none of these disclose a circuit having the simple identifying probe arrangement associated with a portable, battery energized voltage supply and switch control unit of the present invention.

An object of the present invention is the provision of a novel light emitting individual wire or conductor indicator probe and voltage supply unit assembly wherein the probe has a pair of light emitting diodes (LEDs) of different color and is capable of distinctively identifying a number of individual conductors greater than the number of LEDs in the probe.

Another object of the present invention is the provision of a novel conductor identifying detector probe and voltage supply unit as described in the immediately preceding paragraph, wherein electrical circuitry is provided to enable distinctive identification of as many as five different conductors in a multi-conductor cable or conduit by different activation of the two LEDs in the probe.

Other objects, advantages and capabilities of the present invention will become apparent from the following detailed description, taken in conjunction with the accompanying drawings illustrating a preferred embodiment thereof.

DETAILED DESCRIPTION OF A PREFERRED EMBODIMENT

Figure 2:
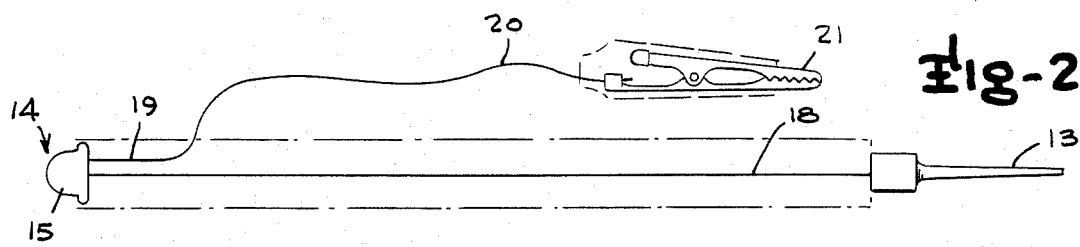
FIG. 2 is a schematic diagram of the detector probe and associated ground clamp, with the probe body shown in phantom lines.
Figure 2A:
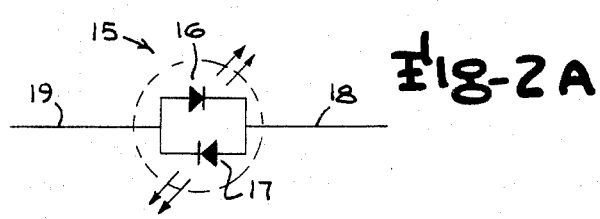
FIG. 2a is a schematic diagram of the internal circuitry of the dome-housed pair of LEDs for the probe.

Referring to the drawings, wherein like reference characters designate corresponding parts throughout the several Figures, the present invention comprises a light emitting probe, indicated generally by the reference character 10, designed to be placed in contact with exposed ends of a plurality of wires or conductors of a multi-conductor cable or a multi-conductor containing conduit, to identify or correlate the individual conductors exiting from what is here referred to as an outlet end of the cable or conduit, with ends of the corresponding conductors at the inlet end of the cable or conduit. In the illustrated embodiment, the probe includes a cylindrical housing in the form of an elongated tubular body 11, which may be of plastic, metal or other desired material, provided, for example, with an insulator or supporting core, indicated at 12 from which projects an electrically conductive probe tip 13. The opposite end of the probe body contains an LED assembly 14, in the form of a single dome 15 and is arranged to selectively emit red light or green light. In the illustrated embodiment, this dome-housed LED assembly may be an XC5491 or Radio Shack 276-035 tri-color LED device which has an internal circuit, as schematically illustrated in FIG. 2a, formed of a red LED 16 and a green LED 17 connected in reverse polarity of each other in the same dome. One of the leads 18 for the reverse polarity connected pair of LEDs 16 and 17 is connected by an internal conductor passing through the core or central portion of the probe body 11 to the conductive probe tip 13, and the opposite lead 19 is connected by an external conductor wire 20 to an alligator clamp 21 which is to be connected to a convenient electrical ground at the outlet end of the conduit or cable.

Figure 1:
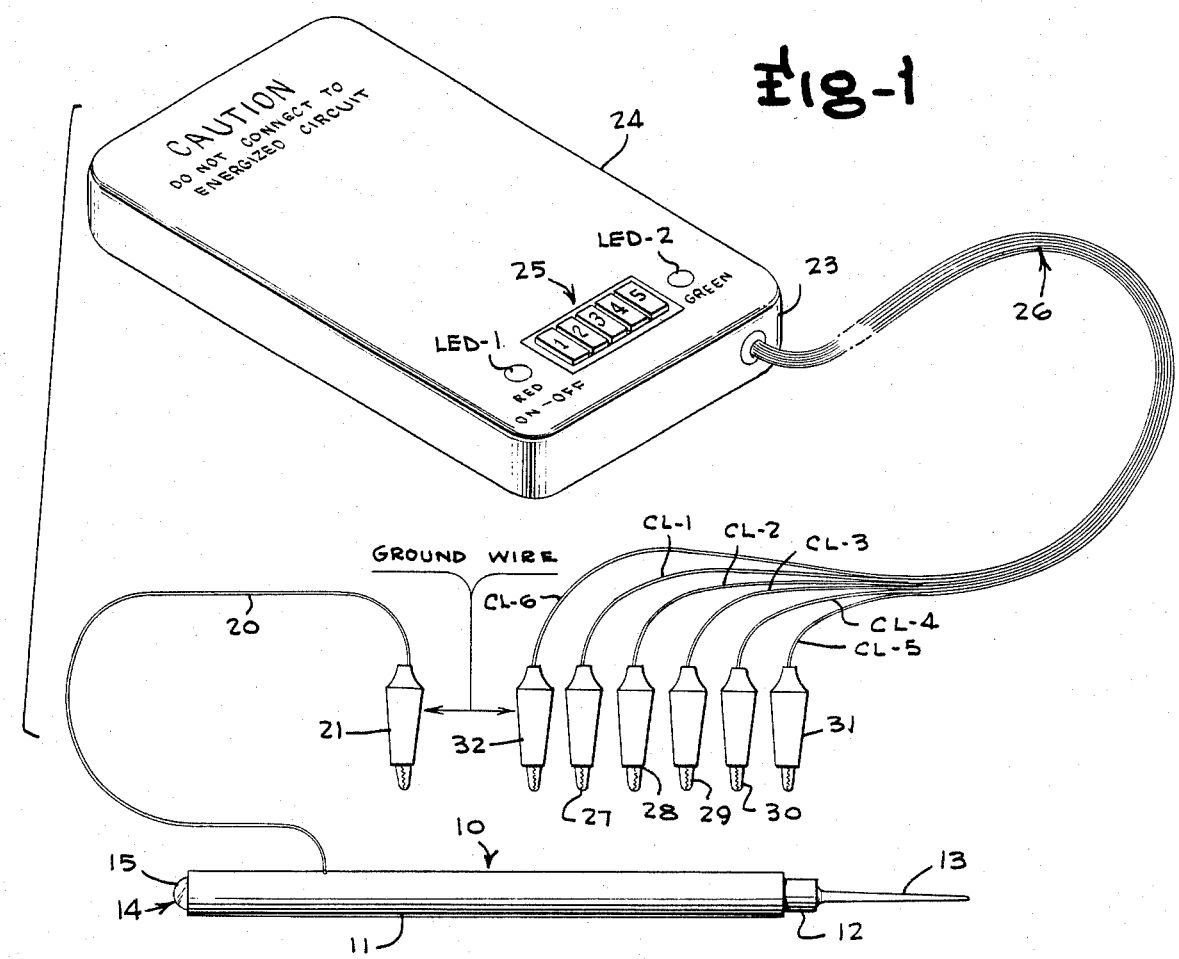
FIG. 1 is a somewhat diagrammatic view of the conductor identifying detector probe and associated voltage supply device of the present invention, with the voltage supply device shown in perspective.

The voltage supply unit or master control unit is indicated generally by the reference character 23 and comprises a generally rectangular housing 24 having a pair of indicating light sources and a bank of five manual switches, which may for convenience be numbered with the digits 1 through 5. The light emitting sources incorporated in the housing 14 and visible from the front face thereof, in the illustrated embodiment, comprise a red light emitting diode, designated LED-1 for indicating on and off condition of the unit, and a green light emitting diode, designated LED-2, which indicates when a current conducting circuit is completed between connectors of two selected external supply connector leads extending from the voltage supply unit 23. The bank of manually controllable switches for the supply unit 23 are indicated as a group by the reference character 25 and are designated individually by reference characters SW-1 through SW-5. Extending from one end wall of the housing 24 for the voltage supply or master control unit 23 is a group of supply connector leads indicated generally by the reference character 26, forming a bundle, either in cable or banded together individual conductor form or the like, forming six supply connector leads CL-1 to CL-6 as indicated in FIGS. 1 and 3, each having an alligator clamp or the like indicated by reference characters 27 through 32 respectively on the ends of the leads remote from the housing 24.

Figure 3:
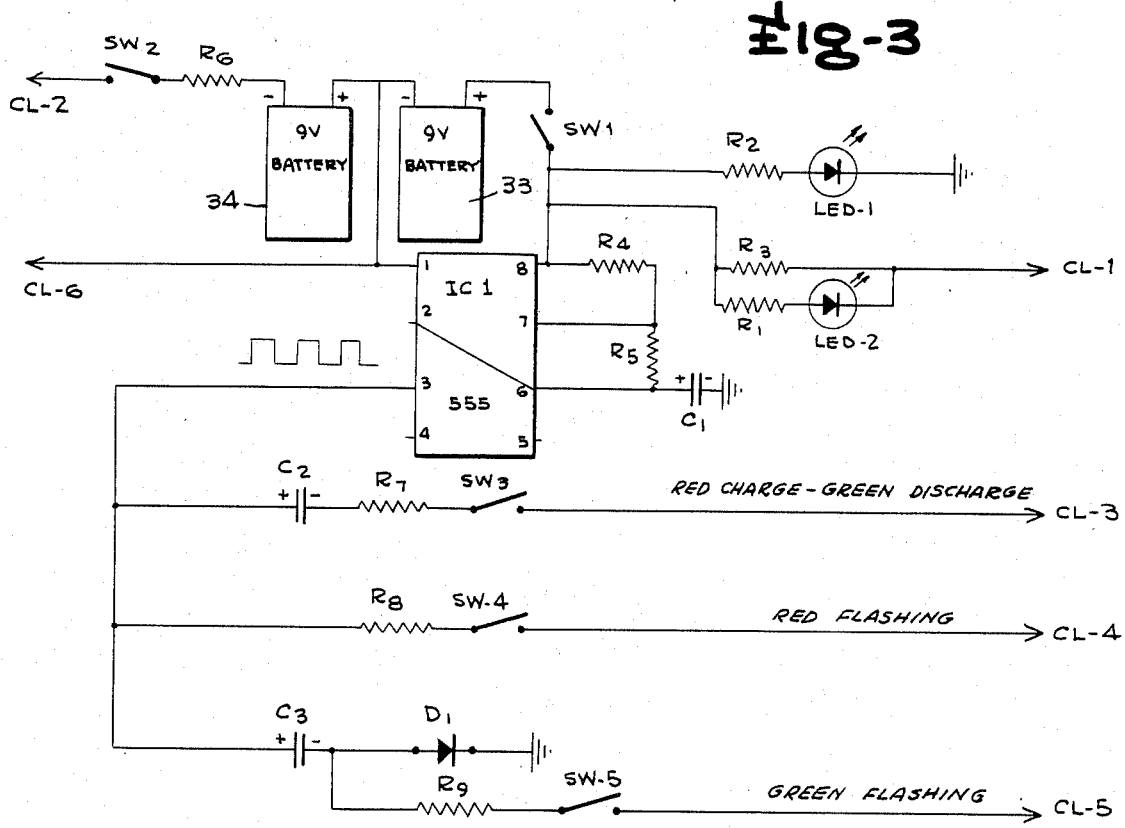
FIG. 3 is a schematic diagram of the voltage supply unit with the integrated circuit chip incorporated therein shown in block diagram form.

The circuit in the housing 24 is schematically indicated in FIG. 3, and comprises a pair of batteries, such as conventional 9 volt rectangular batteries such as Eveready No. 522, indicated at reference characters 33 and 34, connected in series, with the positive terminal of battery 33 connected through switch SW-1 and resistor R-2, and LED-1 incorporated in the housing 24 to electrical ground. The terminal switch SW-1 opposite that connected to the battery 33 is also connected through resistor R-3 to the supply connector leads CL-1, and resistor R-1 and LED-2 form an alternative circuit connected in parallel with resistor R-3 between switch SW-1 and connector lead CL-1. Additionally, the last mentioned terminal switch SW-1 is connected to pin 8 of integrated circuit chip IC-1, which may be an NE-555 which is commercially available 8 pin integrated circuit chip. The negative terminal of the second battery 34 is connected through resistor R-6 and switch SW-2 to supply connector lead CL-2, and the lead interconnecting the negative terminal or battery 33 and positive terminal of battery 34 is connected to pin 1 of the integrated circuit chip IC-1. Pins 2 and 6 of the integrated circuit chip are connected together, pin 6 is connected through resistors R-4 and R-5 to pin 8 and also through capacitor C-1 to ground, pin 7 is connected to the interconnection between resistors R-4 and R-5, and pin 3 of the integrated circuit chip is connected through three channels, one through capacitor C-2 and resistor R-7 and switch SW-3 to connect to lead CL-3, a second through resistor R-8 and switch SW-4 to connector CL-4, and a third through capacitor C-3 which is also connected through resistor R-9 and switch SW-5 to connector lead CL-5 and through a diode D-1 (which may be a 1N908 or equivalent) to electrical ground.

Figure 4:
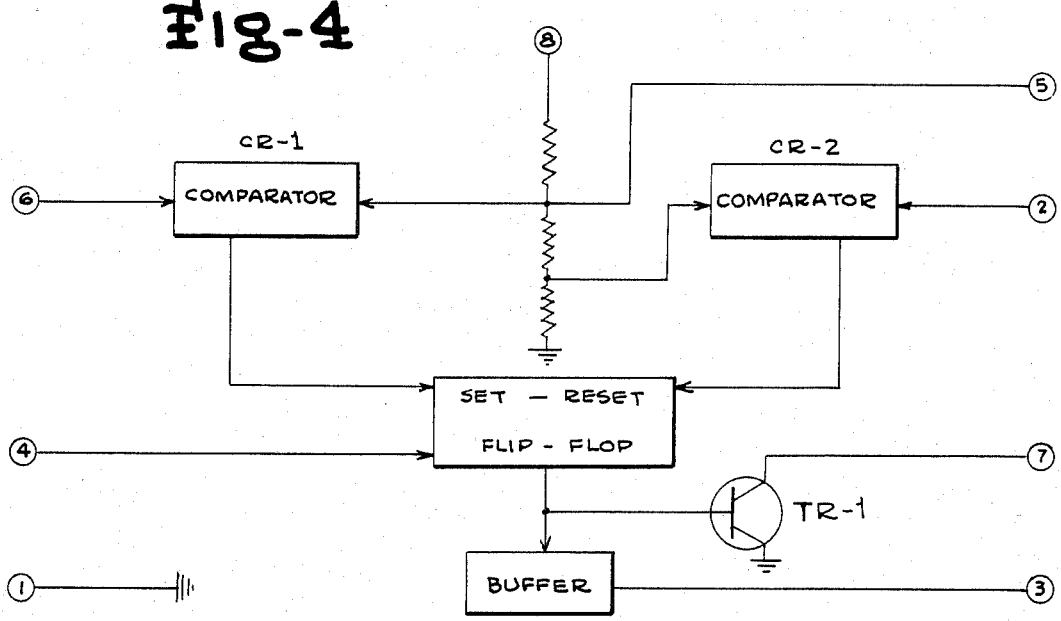
FIG. 4 is a circuit diagram of the integrated circuit chip incorporated in the voltage supply unit.

The internal circuit of the integrated circuit chip IC-1 is indicated in FIG. 4, showing that the chip is basically connected as an astable multi-vibrator, operative such that, when in the on position, assuming pin 3 is high, the charge on capacitor C-1 is low and the "discharge" transistor TR-1 is non-conducting. The capacitor C-1 then begins charging through the resistor R-4 and R-5 in series with switch SW-1 and the plus terminal of battery 33. When the voltage across capacitor C-1 becomes approximately 6 volts, the threshold comparator CR-1 senses this and flips the internal circuitry to the other state. Pin 6 then goes low, and the discharge transistor TR-1 turns on. Capacitor C-1 then discharges through resistor R-5 and the discharge transistor TR-1 to ground. Discharge continues until capacitor C-1 voltage drops to about 3 volts, which is sensed by the "trigger" comparator CR-2 which flips the circuit back to its initial state. This cycle repeats continuously and the voltage on the pin 3 output is thus a rectangular wave form, wherein pin 3 is high when capacitor C-1 is charging and low when capacitor C-1 is discharging.

The resistors R-4 and R-5 and capacitor C-1 set the flip-flop speed, which in the illustrated embodiment is approximately 2.2 cycles per second.

To use the probe for identifying up to five conductors or wires of a plural conductor set such as a cable or multi-wire housing conduit the, for example, five conductors at one end, termed the inlet end, of the conduit or cable are connected to five of the supply connector leads respectively, CL-1 through CL-5 by securing the alligator clamps 27 through 31 to the conductors to be identified. The remaining supply conductor lead CL-6 is connected to an electrical ground. Turning on the switch SW-1 causes positive voltage from the battery 33 to pass through resistor R-2 and turn on the "on" indicator LED-1 and applies voltage to pin 8 of the integrated circuit chip IC-1 and through the current limiting resistor R-3 to supply connector lead CL-1. The resistor R-2 serves as a current limiting resistor for the on indicator LED-1 which provides a pilot light. Resistor R-2 is a current limiting resistor for the green indicator LED-2, which lights when the connector lead CL-1 and a common ground are connected. This portion of the circuit is therefore also useful in checking fuses and so forth, or providing a quick check to see if any of the conductors to be tested are shorted to each other.

The connector leads CL-1 through CL-5 are connected to the five respective conductors to be tested or identified at the input end and, if the conductors to be identified are color coded, the correlation between the colors and the numbers (leads 1–5) of the conductor leads are noted. The ground lead 20 at the probe is then connected to an electrical ground by the alligator clip 21, and the probe tip 13 is then successively placed in contact with the conductors exiting the outlet end of the cable or conduit, while the switches SW-1 through SW-5 are activated in succession. When the switch SW-1 is closed, the probe LED indicator assembly 14 emits red light when the probe tip contacts the conductor connected to the alligator clamp 27 for connector lead CL-1, since positive voltage from the battery 33 is being supplied to the connector lead CL-1. With the switch SW-2 closed, the probe LED indicator 14 emits green light when the probe tip 13 contacts the conductor connected to the alligator clamp 28 and supply connector lead CL-2, since negative voltage is supplied from battery 34 through resistor R-6 to this conductor.

When the probe tip 13 contacts the conductor connected to alligator clamp 29 and supply connector lead CL-3, an alternating red and green light is emitted, since the alternating waveform output from pin 3 of the integrated circuit chip IC-1 is applied through capacitor C-2 and resistor R-7 and switch SW-3 to this conductor since capacitor C-2 alternately charges and discharges through the current limiting resistor R-7 and the connector lead CL-3, the charging of capacitor C-2 activates the red LED 16 of the phase probe indicator 14 and the discharging occurs through the green LED 17 of the phase probe activating the green LED, thus producing the alternating red and green light effect.

When switch SW-4 is closed and the probe tip 13 contacts the conductor connected to connector lead CL-4, current passes through resistor R-8 to connector lead CL-4 providing interrupted approximately 7 volt positive peaks because of the square wave output from pin 3 of the integrated circuit causing flashing red light to be emitted by the red LED 16 of the probe. When switch SW-5 is closed and the probe tip 13 contacts the conductor connected to connector lead CL-5, capacitor C-3 charges through diode D-1 to ground and discharges through the green LED 17 of the probe alternately in accordance with the square wave output of the integrated circuit pin 3, producing flashing green light at the probe.

Thus, a convenient portable apparatus is provided which permits rapid identification of the opposite ends of up to five wires or conductors extending through a conduit or incorporated in a cable in a novel manner and with a convenient probe arrangement, and which also may be used in rapidly checking fuses, circuit continuity, and detecting existence of shorting between conductors in multi-conductor systems.

I claim:

1. A portable probe-type conductor identifying and voltage supply device for identifying individual conductors in a plural conductor group extending through a conduit system, cable or the like, comprising a probe having a contact tip for engaging the individual conductors at one end of the plural conductor group and a grounding wire lead and terminal clamp device extending therefrom for releasable attachment to electrical ground at said one end, the probe further including a pair of light emitting diodes for emitting a first color and a second color respectively connected in reverse polarity parallel circuit arrangement between said contact tip and said grounding wire lead; a portable voltage supply unit including a casing housing batteries and having a plurality of manual switches and a like number of respectively associated connector leads with terminal clamp devices thereon and voltage control circuit means therefor, a grounding wire lead and clamp device for said voltage supply unit for attachment to electrical ground at a second end of the plural conductor group opposite said one end, said voltage control circuit means including means responsive to first and second pairs of said switches respectively to apply proper polarity voltages to their associated connector leads when connected at said second end to conductors of said group and when the probe tip engages such conductors to activate the diodes to emit their respective colors as steady light for said first pair of switches and as flashing light for said second pair of switches for identification of the conductors associated with said connector leads by such colors and light character emitted by the probe.

2. A portable probe-type conductor identifying and voltage supply device as defined in claim 1, wherein said circuit control means includes further circuit means responsive to another of said manual switches applying proper voltage to its associated connector lead for applying voltage through the probe contact tip to said light emitting diodes causing them to both be energized in alternation producing a further distinctive light emission for the conductor electrically connected with said last mentioned switch.

3. A portable probe-type conductor identifying and voltage supply device as defined in claim 1, wherein said pair of light emitting diodes consist of a green light emitting diode and a red light emitting diode connected in reverse polarity parallel electrical circuit connection in said probe.

4. A portable probe-type conductor identifying and voltage supply device as defined in claim 1, wherein said pair of light emitting diodes consist of a green light emitting diode and a red light emitting diode connected in reverse polarity parallel electrical circuit connection in said probe and wherein both said diodes are incorporated in a single dome through which the light emitted thereby is visible.

5. A portable probe-type conductor identifying and voltage supply device as defined in claim 1, wherein said probe includes an elongated probe body having said contact tip at one end thereof and said pair of light emitting diodes consist of a green light emitting diode and a red light emitting diode connected in reverse polarity parallel electrical circuit connection in said probe and wherein both said diodes are incorporated in a single dome at the other end of said body opposite said one end through which the light emitted thereby is visible.

6. A portable probe-type conductor identifying and voltage supply device as defined in claim 2, wherein said pair of light emitting diodes consist of a green light emitting diode and a red light emitting diode connected in reverse polarity parallel electrical circuit connection in said probe.

7. A portable probe-type conductor identifying and voltage supply device as defined in claim 2, wherein said pair of light emitting diodes consist of a green light emitting diode and a red light emitting diode connected in reverse polarity parallel electrical circuit connection in said probe and wherein both said diodes are incorporated in a single dome through which the light emitted thereby is visible.

8. A portable probe-type conductor identifying and voltage supply device as defined in claim 2, wherein said probe includes an elongated probe body having said contact tip at one end thereof and said pair of light emitting diodes consist of a green light emitting diode and a red light emitting diode connected in reverse polarity parallel electrical circuit connection in said probe and wherein both said diodes are incorporated in a single dome at the other end of said body opposite said one end through which the light emitted thereby is visible.

9. A portable probe-type conductor identifying and voltage supply device as defined in claim 1, wherein said voltage supply unit includes an integrated circuit chip connected as an astable multi-vibrator producing a square wave voltage output applied through circuits including said pair of switches producing flashing light at the probe light emitting diodes.

10. A portable probe-type conductor identifying and voltage supply device as defined in claim 2, wherein said voltage supply unit includes an integrated circuit chip connected as an astable multi-vibrator producing a square wave voltage output applied through circuits including said pair of switches producing flashing light at the probe light emitting diodes and the switch controlling the connector lead circuit for producing alternating energizing of said light emitting diodes.

11. A portable probe-type conductor identifying and voltage supply device as defined in claim 3, wherein said voltage supply unit includes an integrated circuit chip connected as an astable multi-vibrator producing a square wave voltage output applied through circuits including said pair of switches producing flashing light at the probe light emitting diodes.

12. A portable probe-type conductor identifying and voltage supply device as defined in claim 5, wherein said voltage supply unit includes an integrated circuit chip connected as an astable multi-vibrator producing a square wave voltage output applied through circuits including said pair of switches producing flashing light at the probe light emitting diodes.

13. A portable probe-type conductor identifying and voltage supply device as defined in claim 7, wherein said voltage supply unit includes an integrated circuit chip connected as an astable multi-vibrator producing a square wave voltage output applied through circuits including said pair of switches producing flashing light at the probe light emitting diodes and the switch controlling the connector lead circuit for producing alternating energizing of said light emitting diodes.

14. A portable probe-type conductor identifying and voltage supply device as defined in claim 8, wherein said voltage supply unit includes an integrated circuit chip connected as an astable multi-vibrator producing a square wave voltage output applied through circuits including said pair of switches producing flashing light at the probe light emitting diodes and the switch controlling the connector lead circuit for producing alternating energizing of said light emitting diodes.

* * * * *